United States Patent [19]

Tomura et al.

[11] Patent Number: 5,628,919
[45] Date of Patent: May 13, 1997

[54] METHODS FOR PRODUCING A CHIP CARRIER AND TERMINAL ELECTRODE FOR A CIRCUIT SUBSTRATE

[75] Inventors: Yoshihiro Tomura, Hirakata; Yoshihiro Bessho, Higashiosaka; Yasuhiko Hakotani, Nishinomiya, all of Japan

[73] Assignee: Matsushita Electric Industrial Co., Ltd., Kadoma, Japan

[21] Appl. No.: 439,980

[22] Filed: May 12, 1995

Related U.S. Application Data

[62] Division of Ser. No. 353,438, Dec. 9, 1994.

[30] Foreign Application Priority Data

| Dec. 13, 1993 | [JP] | Japan | 5-311980 |
| Dec. 15, 1993 | [JP] | Japan | 5-314966 |
| Dec. 20, 1993 | [JP] | Japan | 5-320117 |
| Dec. 20, 1993 | [JP] | Japan | 5-320126 |

[51] Int. Cl.⁶ ............................................. B44C 1/22
[52] U.S. Cl. ................ 216/18; 156/89; 216/33; 216/20
[58] Field of Search ............... 216/13, 18, 20, 216/33, 39; 156/629.1, 633.1, 634.1, 656.1, 659.11, 661.11; 29/827, 852; 257/778; 437/180, 203, 209; 427/97

[56] References Cited

U.S. PATENT DOCUMENTS

| 4,714,570 | 12/1987 | Nakatani et al. | 252/518 |
| 4,825,284 | 4/1989 | Soga et al. | 257/778 |
| 5,004,640 | 4/1991 | Nakatani et al. | 428/195 |
| 5,118,386 | 6/1992 | Katooka et al. | 156/656 |
| 5,196,089 | 3/1993 | Takada et al. | 156/645 |
| 5,213,676 | 5/1993 | Reeke et al. | 205/118 |
| 5,231,757 | 8/1993 | Chantraine et al. | 216/18 X |
| 5,239,448 | 8/1993 | Perkins et al. | 257/778 |
| 5,241,133 | 8/1993 | Mullen, III et al. | 174/52.4 |
| 5,260,518 | 11/1993 | Tanaka et al. | 174/261 |
| 5,281,151 | 1/1994 | Arima et al. | 257/778 |
| 5,315,239 | 5/1994 | Vitrial | 324/158 F |
| 5,316,788 | 5/1994 | Debbie et al. | 427/98 |
| 5,408,121 | 4/1995 | Nakamura et al. | 257/447 |

FOREIGN PATENT DOCUMENTS

| 0265631 | 5/1988 | European Pat. Off. |
| 0514723 | 11/1992 | European Pat. Off. |
| 0520434 | 12/1992 | European Pat. Off. |
| 0536418 | 4/1993 | European Pat. Off. |
| 58-010841 | 1/1983 | Japan . |
| 59-158539 | 9/1984 | Japan . |
| 61-024253 | 2/1986 | Japan . |
| 62-266857 | 11/1987 | Japan . |
| 36544 | 2/1992 | Japan | 257/778 |
| 226487 | 9/1993 | Japan | 257/778 |
| 243330 | 9/1993 | Japan | 257/778 |
| 15521 | 8/1993 | WIPO | 257/778 |

OTHER PUBLICATIONS

Search Report for European Appl. 94119486.2, mailed Jan. 5, 1996.
Search Report for European Appl. 94119486.2, mailed Oct. 30, 1995.
EP & P News, 31 (1991) Jun., No. 6, Mass, "Advanced Packaging Systems Completes 100 MCM Designs."
Nicoles et al, "Evolution des Technologies d'interconnection et d' Encapsulation . . . ", pp. 48–54, Nov.–Dec. 93, vol. 73, No. 6.
Nikkei Electronics, No. 587, "LSI Package Frontier, Prompting High Density Mounting", Aug. 2, 1993, pp. 93–99 (Partial Translation Included).

*Primary Examiner*—William Powell
*Attorney, Agent, or Firm*—Renner, Otto, Boisselle & Sklar

[57] ABSTRACT

A chip carrier according to the present invention includes: a carrier body including an upper face, a lower face, and an internal conductor; and a plurality of terminal electrodes formed on the upper face of the carrier body, the plurality of terminal electrodes electrically connecting an LSI chip to the internal conductor. A plurality of concave portions for electrically connecting a plurality of electrodes on a circuit substrate to the internal conductor are provided on the lower face of the carrier body, the concave portions being electrically connected to the internal conductor.

12 Claims, 9 Drawing Sheets

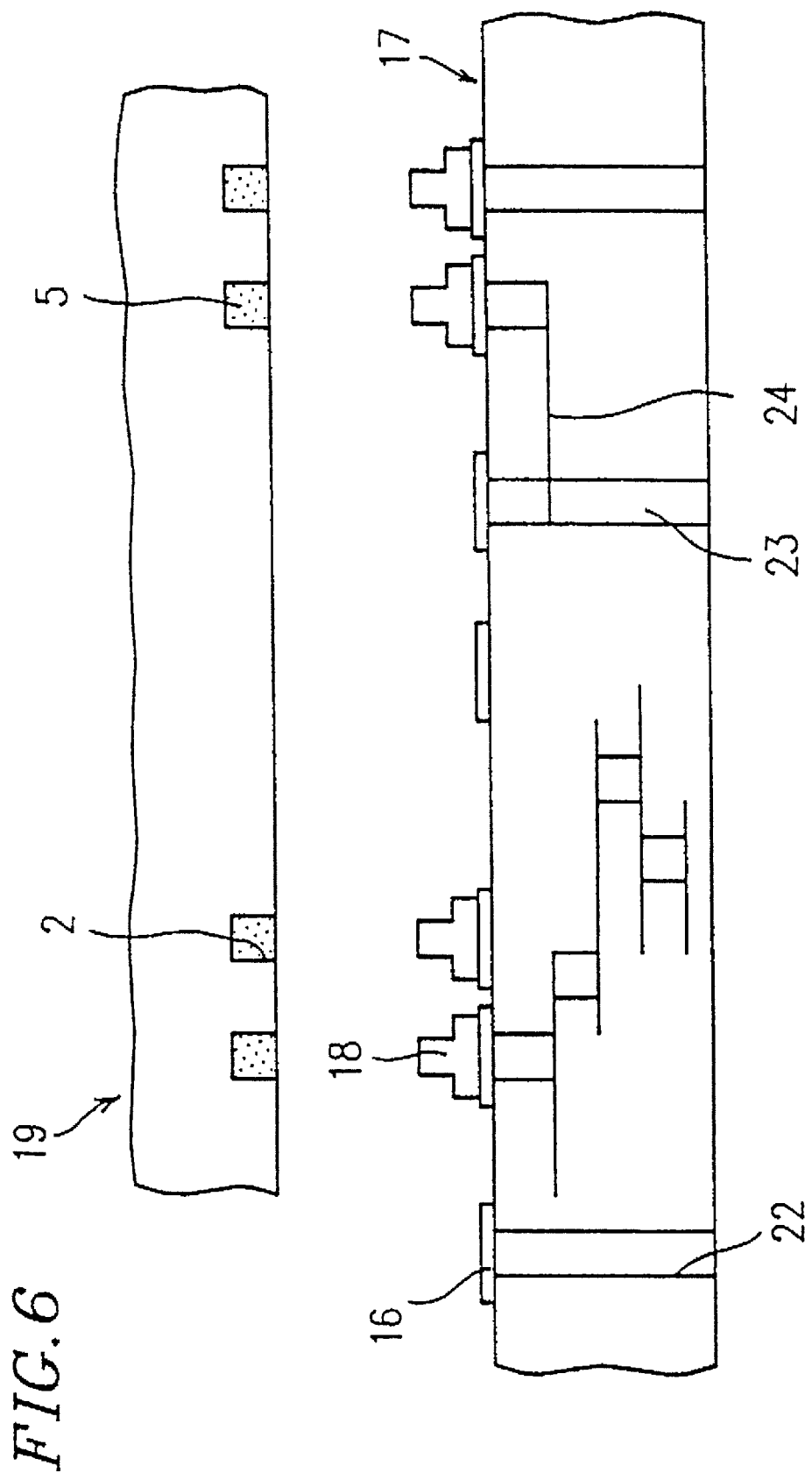

METHODS FOR PRODUCING A CHIP CARRIER AND TERMINAL ELECTRODE FOR A CIRCUIT SUBSTRATE

This is a division of application Ser. No. 08/353,438, filed Dec. 9, 1994.

BACKGROUND OF THE INVENTION

1. Field of the Invention

The present invention relates to: a chip package, a chip carrier, and a method for producing the same; a terminal electrode for a circuit substrate and a method for producing the same; and a complex including the above-mentioned chip package mounted on a circuit substrate (hereinafter, such a complex will be referred to as a "chip package-mounted complex").

2. Description of the Related Art

In recent years, the integration degrees of LSIs (Large Scale Integrated Circuits) have remarkably improved, and, accordingly, the number of pins included in one LSI chip has been increasing. As for electronic equipment incorporating LSI chip packages, the size and the thickness thereof have been desired to be reduced. Accordingly, a number of high-density mounting techniques for mounting LSI chips on a circuit substrate at a high density have been developed. A variety of shapes and structures have been proposed for such LSI chip packages (NIKKEI ELECTRONICS 1993. 8.2, No. 587, "LSI package frontier, prompting high-density mounting", pp 93 to 99).

In the present specification, the term "chip carrier" refers to a substrate including terminal electrodes (which are to be connected to electrodes of an LSI chip) and contact electrodes (which are to be connected to a circuit substrate). The term "chip package" refers to a chip carrier with an LSI chip mounted thereon. The chip package, as a whole, is to be mounted on a circuit substrate so as to form a "chip package-mounted complex".

Hereinafter, a method for mounting a conventional chip package onto a circuit substrate will be briefly described.

First, a chip carrier is formed in the following manner. Via holes are formed in a printed circuit board by using a laser beam or by a mold punching technique. A ceramic board may be used instead of a printed circuit board. Terminal electrodes are previously formed on both faces of the printed circuit board. Thereafter, an internal conductor in the printed circuit board is electrically connected to the terminal electrodes by a plating technique or the like. Next, an LSI chip is adhered to an upper face of the above-mentioned chip carrier in a face-up state by using a die bond. Thereafter, electrode pads of the LSI chip are connected to the terminal electrodes present on the upper face of the chip carrier by a wire bonding technique. On the resultant composite, a mold resin is applied so as to cover the LSI chip and the wire bonding, thereby sealing the composite.

Next, a solder layer is formed on the terminal electrodes provided on a lower face (i.e., the face which opposes the circuit substrate when the chip package is mounted on a circuit substrate) of the printed circuit board by printing or the like. Thereafter, the solder is melted by an infrared reflow technique or the like, so as to form solder balls (having diameters in the vicinity of 700 µm). Thus, a chip carrier is obtained. It is also applicable to adhere previously prepared solder balls onto the terminal electrodes of the chip carrier. Thus, a chip package is obtained.

Furthermore, the chip package is positioned with respect to the circuit substrate in such a manner that the solder balls are located in predetermined positions on the circuit substrate. Then, the chip package is disposed on the circuit substrate. Thereafter, the solder balls are melted by an infrared reflow technique or the like, so as to connect the terminal electrodes on the lower face of the chip package to terminal electrodes of the circuit substrate. Thus, a chip package-mounted complex is obtained.

However, the above-mentioned prior art technique has the following problems:

1. Since wire bonding is conducted for connecting the terminal electrodes of the chip carrier to the electrode pads of the LSI chip, an area occupied by the chip carrier becomes larger than an area occupied by the LSI chip. Moreover, because of the mold resin sealing process conducted after the wire bonding connection, the resultant chip package becomes thicker than the height of the loop height of the wire bonding. This hinders the reduction of the size and the thickness of the chip package.

2. Since signals travel through the wire bonding, which have relatively large lengths, the input/output signals are likely to be delayed. Accordingly, the high-frequency characteristics of the chip package deteriorate, so that the chip package is likely to pick up noises.

3. The solder balls, disposed in an array on the lower face of the chip package, prevent the pitch of the terminals of the LSI chip from being reduced. The solder balls are typically arranged at a pitch as large as about 1 mm.

4. The size of the solder balls determines the distance between the chip package and the circuit substrate. In other words, the interval between the chip package and the circuit substrate cannot be made smaller than the size of the solder balls.

5. In the case where the substrate of the chip carrier is made of a different material from that of the circuit substrate, stresses caused due to a thermal impact will concentrate on the solder connection portions, thereby creating cracks. As a result, the electrical resistance of the solder connection portions may increase.

SUMMARY OF THE INVENTION

A chip carrier according to the present invention includes: a carrier body including an upper face, a lower face, and an internal conductor; and a plurality of terminal electrodes formed on the upper face of the carrier body, the plurality of terminal electrodes electrically connecting an LSI chip to the internal conductor, wherein a plurality of concave portions for electrically connecting a plurality of electrodes on a circuit substrate to the internal conductor are provided on the lower face of the carrier body, the concave portions being electrically connected to the internal conductor.

In one embodiment of the invention, the chip carrier further includes a plurality of contact electrodes electrically connected to the electrodes on the circuit substrate, the contact electrodes being buried in respective ones of the plurality of concave portions, wherein the contact electrodes are composed of a conductive adhesive.

In another embodiment of the invention, the plurality of contact electrodes project from the lower face of the carrier body.

In still another embodiment of the invention, the carrier body includes a plurality of via holes; at least a portion of the internal conductor is composed of a conductive material provided in the plurality of via holes; and at least some of the plurality of concave portions of the carrier body are constituted by the plurality of via holes.

In still another embodiment of the invention, the carrier body is composed of a plurality of insulation sheets layered on one another, the carrier body including a plurality of via holes for connecting the upper face to the lower face, and wherein the internal conductor is composed of a conductive material provided in the plurality of via holes and a conductive layer provided on at least one of the plurality of insulation sheets.

In still another embodiment of the invention, the conductive adhesive has flexibility.

In still another embodiment of the invention, the internal conductor is composed of a material selected from the group consisting of Cu, Ag, and AgPd.

Alternatively, a chip package according to the present invention includes a chip carrier and an LSI chip mounted on the chip carrier in a flip-chip fashion, the chip carrier including: a carrier body including an upper face, a lower face, and an internal conductor; a plurality of terminal electrodes formed on the upper face of the carrier body, the plurality of terminal electrodes electrically connecting an LSI chip to the internal conductor; and a plurality of concave portions for electrically connecting a plurality of electrodes on a circuit substrate to the internal conductor, the concave portions being provided on the lower face of the carrier body, wherein the LSI chip includes: an electrode pad provided on the LSI chip and a projection electrode formed on the electrode pad, the projection electrode being electrically connected to a corresponding one of the terminal electrodes of the chip carrier with a bonding layer interposed therebetween, and an interspace between the LSI chip and the chip carrier being filled with and sealed by a mold resin.

In one embodiment of the invention, the chip package further includes a plurality of contact electrodes electrically connected to the electrodes on the circuit substrate, the contact electrodes being buried in respective ones of the plurality of concave portions, wherein the contact electrodes are composed of a conductive adhesive.

In another embodiment of the invention, the projection electrode of the LSI chip has a two-step convex shape.

In still another embodiment of the invention, the conductive adhesive has flexibility.

In still another embodiment of the invention, the bonding layer is composed of a material selected from the group consisting of a conductive adhesive, an anisotropic conductive material, and solder.

Alternatively, a chip package according to the present invention includes a chip carrier and an LSI chip mounted on the chip carrier in a flip-chip fashion, the chip carrier including: a carrier body including an upper face, a lower face, and an internal conductor; a plurality of terminal electrodes formed on the upper face of the carrier body, the plurality of terminal electrodes electrically connecting an LSI chip to the internal conductor; and a plurality of contact electrodes for electrically connecting a plurality of electrodes on a circuit substrate to the internal conductor, the contact electrodes being provided on the lower face of the carrier body, and the contact electrodes being composed of a conductive adhesive and buried in a plurality of concave portions formed on the lower face of the carrier body, wherein the LSI chip includes: an electrode pad provided on the LSI chip and a projection electrode formed on the electrode pad, the projection electrode being electrically connected to a corresponding one of the terminal electrodes of the chip carrier with a bonding layer interposed therebetween, and an interspace between the LSI chip and the chip carrier being filled with and sealed by a mold resin.

In one embodiment of the invention, the projection electrode of the LSI chip has a two-step convex shape.

In another embodiment of the invention, the conductive adhesive has flexibility.

In still another embodiment of the invention, the bonding layer is composed of a material selected from the group consisting of a conductive adhesive, an anisotropic conductive material, and solder.

A method for producing a chip carrier according to the present invention includes the steps of: forming via holes in a plurality of unsintered green sheets; burying a portion of an internal conductor in the via holes of a group of the plurality of green sheets and forming an internal conductor on the group of the plurality of green sheets by printing; obtaining a multilayer structure by layering one of the plurality of solders in which a portion of the internal conductor is not buried in the via holes thereof on the group of green sheets in which the portion of the internal conductor is buried in the via holes and subjecting the multilayer structure to a pressing process; and sintering the plurality of green sheets so as to form a carrier body, a plurality of concave portions being formed on a lower face of the carrier body.

In one embodiment of the invention, the method further includes a step of forming a plurality of contact electrodes by burying a conductive adhesive in the plurality of concave portions of the carrier body.

In another embodiment of the invention, the conductive adhesive has flexibility.

A terminal electrode for a circuit substrate according to the present invention, on which a chip package is mounted, is formed on the circuit substrate and includes: a lower step portion formed on the circuit substrate; and an upper step portion formed on the lower step portion.

In one embodiment of the invention, an area of a cross section of the upper step portion taken on a plane parallel to the circuit substrate is smaller than an area of a cross section of the lower step portion taken on a plane parallel to the circuit substrate.

Alternatively, a method for producing a terminal electrode for a circuit substrate according to the present invention includes the steps of: forming a first resist film on the circuit substrate by a first photolithography process, the first resist film having a first opening on an electrode pad of the circuit substrate; forming a lower step portion of the terminal electrode in the first opening of the first resist film; forming a second resist film on the circuit substrate by a second photolithography process, the second resist film having a second opening on the lower step portion of the terminal electrode and the second opening being smaller than the first opening of the first resist film; forming an upper step portion of the terminal electrode in the second opening of the second resist film; and removing the first and second resist films, whereby the terminal electrode is formed.

A chip package-mounted complex according to the present invention includes a chip package mounted on a circuit substrate, the chip package including a chip carrier and an LSI chip mounted on the chip carrier in a flip-chip fashion, wherein the chip carrier includes: a carrier body including an upper face, a lower face, and an internal conductor; a plurality of terminal electrodes formed on the upper face of the carrier body, the plurality of terminal electrodes electrically connecting an LSI chip to the internal conductor; and a plurality of contact electrodes for electrically connecting a plurality of electrodes on a circuit substrate to the internal conductor, the contact electrodes being provided on the lower face of the carrier body, and the contact electrodes being composed of a conductive adhesive and buried in a plurality of concave portions formed on the lower face of the carrier body, wherein the LSI chip includes: an electrode pad provided on the LSI chip and a projection electrode formed on the electrode pad, the projection electrode being electrically connected to a corresponding one of the terminal electrodes of the chip carrier with a bonding layer interposed therebetween, and an interspace between the LSI chip and the chip carrier being filled with and sealed by a mold resin, and wherein the circuit substrate includes a terminal electrode connected to a corresponding one of the contact electrodes of the chip carrier.

In one embodiment of the invention, the terminal electrode of the circuit substrate projects toward a corresponding one of the concave portions of the carrier body.

In another embodiment of the invention, the terminal electrode of the circuit substrate has a two-step concave shape.

In accordance with the chip carrier according to the present invention, terminal electrodes for mounting an LSI chip in a flip-chip fashion are provided on an upper face of a carrier body. On a lower face of the carrier body, contact electrodes to be connected to electrodes present on a circuit substrate are provided. Moreover, the terminal electrodes and the contact electrodes are electrically interconnected by means of an internal conductor provided within the carrier body. By using such a chip carrier, a circuit on the LSI chip can be connected to a circuit on the circuit substrate without occupying a large space. Since no wire bonding is used for the interconnection between the LSI chip and the circuit substrate, electric signals travel through a relatively short route created between the LSI chip and the circuit substrate. As a result, the resistor components and capacitor components are reduced, as compared to the case where wire bonding is used, so that the high-frequency characteristics of the chip carrier or the chip package are improved. In addition, by utilizing the internal conductor in the carrier body and the like, it becomes possible to adopt a different arrangement layout for the terminal electrodes from that of the contact electrodes.

Furthermore, the contact electrodes are formed of a conductive adhesive buried in a multitude of concave portions on the lower face of the carrier body. The conductive adhesive serves to, as well as mechanically adhering the carrier body to the circuit substrate, electrically connect the internal conductor of the carrier body to the terminal electrodes of the circuit substrate. By ensuring that the contact electrodes are located in the multitude of concave portions on the lower face of the carrier body, the size of an interspace between the carrier body and the circuit substrate can be reduced. Since the contact electrodes are formed of a conductive adhesive, the interconnection between the contact electrodes and the circuit substrate becomes stable, thereby achieving an improved reliability. In particular, the interconnection becomes resistant against thermal impacts.

In the method for producing a chip carrier according to the present invention, the formation of the contact electrodes is easily achieved by filling the concave portions formed on the lower face of the carrier body with a conductive adhesive.

The chip package according to the present invention, including an LSI chip mounted in a flip-chip fashion on the above-mentioned chip carrier, is compact and thin. Since the step of filling the multitude of concave portions on the lower face of the carrier body can be performed in a relatively simple manner, it is possible for one who has purchased the chip package to conduct the step by himself immediately before mounting the chip package on a circuit substrate.

The terminal electrodes for a circuit substrate, according to the present invention, have a convex shape and therefore are easy to insert into the concave portions constituting the contact electrodes of the chip carrier. In the method for producing the terminal electrodes according to the present invention, minute projection electrodes of a two-step shape can be easily formed with a high yield by adopting a photolithography technique.

In accordance with the chip package-mounted complex of the present invention, contact electrodes are formed of a conductive adhesive, so that a chip carrier can be connected to a circuit substrate in a mechanically/electrically stable manner.

Thus, the invention described herein makes possible the advantages of (1) providing a chip package which has a reduced size and a reduced thickness and excellent high-frequency characteristics and which is capable of being connected to a circuit substrate with a high reliability and stability; (2) providing a chip carrier for the above-mentioned chip package and a method for producing the same; (3) and providing a terminal electrode for a circuit substrate to be suitably used for the above-mentioned chip package and a method for producing the same, and further providing a chip package-mounted complex including the above-mentioned chip package mounted on a circuit substrate.

These and other advantages of the present invention will become apparent to those skilled in the art upon reading and understanding the following detailed description with reference to the accompanying figures.

BRIEF DESCRIPTION OF THE DRAWINGS

FIG. 6 is a cross-sectional view showing convex terminal electrodes for a circuit substrate according to the present invention.

DESCRIPTION OF THE PREFERRED EMBODIMENTS

Hereinafter, the present invention will be described by way of examples, with reference to the accompanying drawings.

Figure 1:
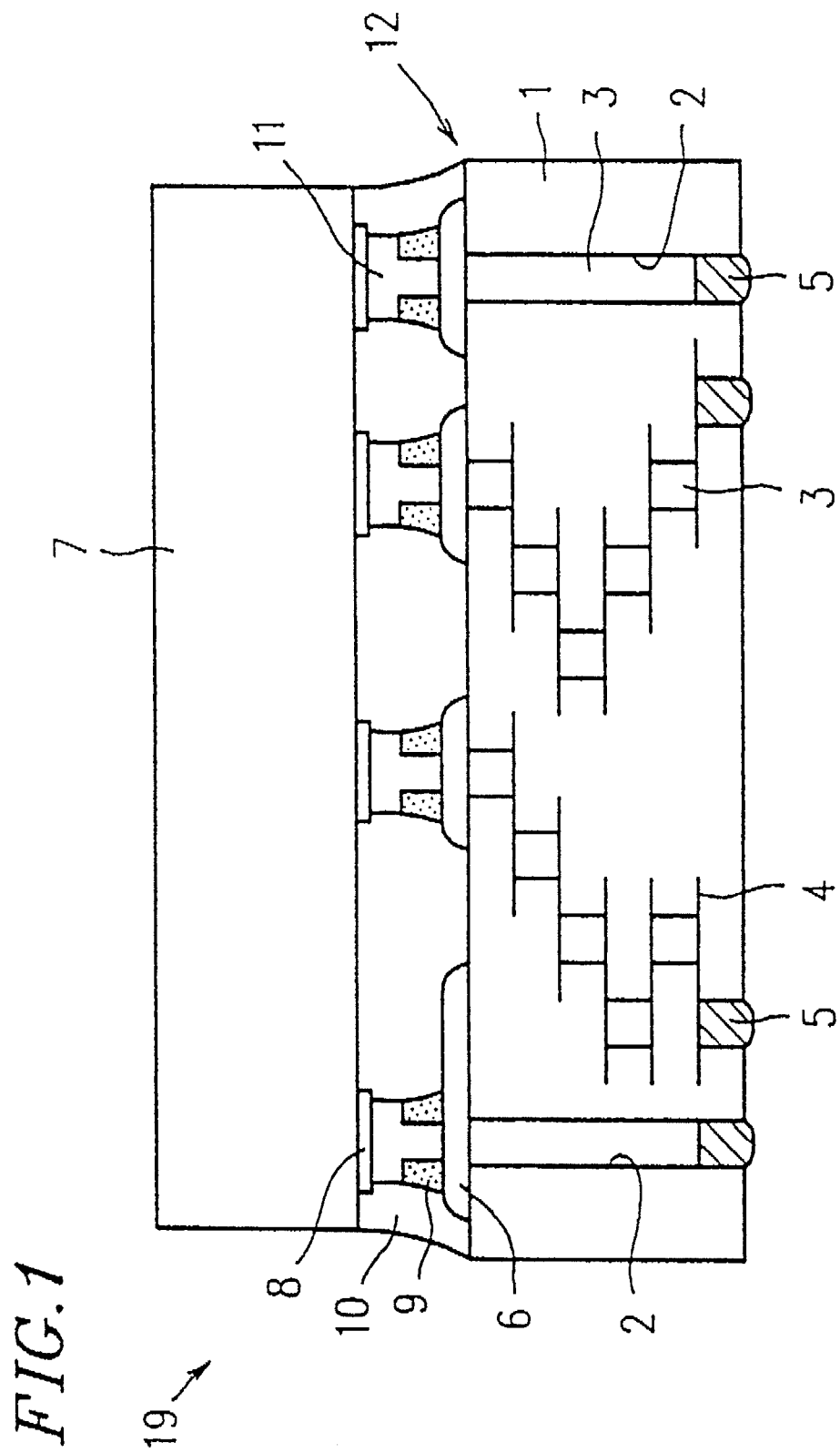
FIG. 1 is a schematic cross-sectional view showing a chip package according to the present invention.

As shown in FIG. 1, a chip package 19 according to the present example includes a chip carrier 12 and an LSI chip 7 mounted on the chip carrier 12 in a flip-chip fashion.

The LSI chip 7 includes a plurality of electrode pads 8 and projection electrodes 11 in such a manner that one projection electrode 11 is formed on each electrode pad 8. Any known and suitable LSI chip may be used as the LSI chip 7. The size of the LSI chip 7 to be used in the present invention is typically 10 mm by 10 mm by 0.5 mm. The electrode pads 8 and the projection electrodes 11 are provided in a peripheral portion of the LSI chip 7. The electrode pads 8 and the projection electrodes 11 are used for connecting the wiring of an integrated circuit formed on the LSI chip 7 to an external circuit. The projection electrodes 11 are typically disposed at a pitch in the range of about 0.200 mm to about 0.120 mm at present. Even smaller pitches are likely to be adopted for the projection electrodes 11 in the future. Each projection electrode 11 is electrically connected to one of a plurality of terminal electrodes 6 of the chip carrier 12 with a bonding layer (conductive adhesive) 9 interposed therebetween. The projection electrodes 11 preferably have a two-step convex shape (i.e. a shape consisting of one convex portion lying on top of another), so as to ensure a stable interconnection between the projection electrodes 11 and the terminal electrodes 6 of the chip carrier 12. The bonding layer (conductive adhesive) 9 may be formed of an anisotropic material or solder, instead of a conductive adhesive. An interspace between the LSI chip 7 and the chip carrier 12 is filled with a mold resin 10 so as to be sealed thereby.

Figure 3:
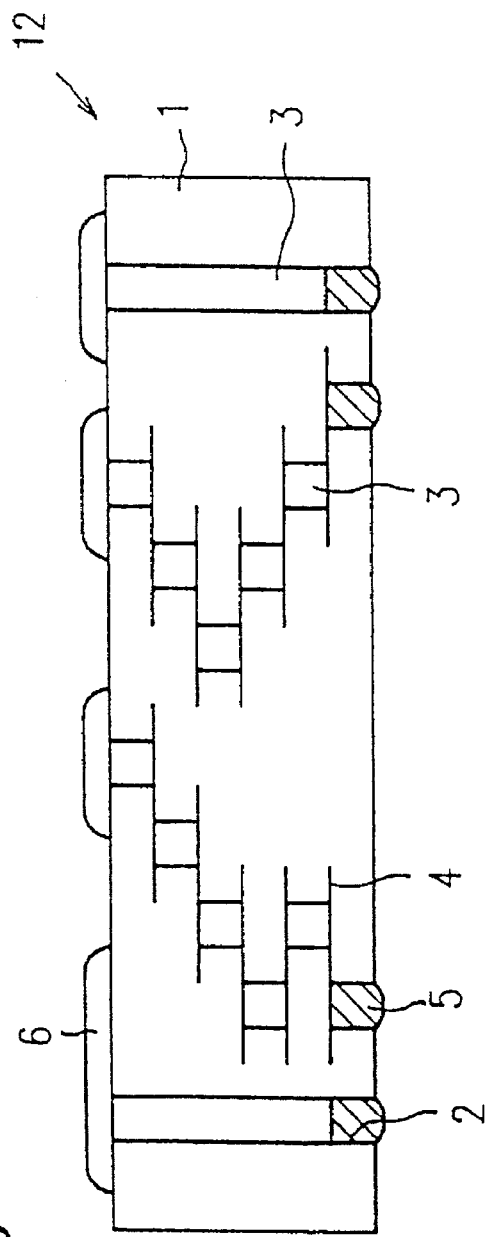
FIG. 3 is a schematic cross-sectional view showing a chip carrier according to the present invention.

Next, the chip carrier 12 will be described in detail, with reference to FIG. 3. The chip carrier according to the present example includes a multilayered ceramic substrate as a carrier body 1, the carrier body 1 further including an internal conductor. On an upper face of the carrier body 1, a plurality of terminal electrodes 6 for electrically connecting the projection electrodes 11 of the LSI chip 7 to the internal conductor are provided. On a lower face of the carrier body 1, a plurality of concave portions for electrically connecting electrodes of a circuit substrate (not shown in FIG. 3) to the internal conductor are provided. Each concave portion has a depth in the range of about 20 µm to about 100 µm, and an inner diameter of about 200 µm. In each concave portion, one of a plurality of contact electrodes 5 is buried in such a manner that the contact electrodes 5 are in contact with the electrodes on the circuit substrate. In the present example, the contact electrodes 5 project from the lower face of the carrier body 1 by about 10 µm to about 20 µm. However, the contact electrodes 5 do not need to project from the lower face of the carrier body 1 in cases where the electrodes of the circuit substrate have a two-step convex structure, which will be described later.

Each contact electrode 5 is electrically connected to a corresponding one of the terminal electrodes 6 by means of the internal conductor. As a result, an electrical interconnection is achieved between the LSI chip 7 and the circuit substrate (not shown), without using wire bonding. Thus, excellent high-frequency characteristics are provided. In the present example, the internal conductor in the carrier body 1 is composed of vias 3, which are buried in via holes 2 of the carrier body 1, and intra-substrate wiring 4. The internal conductor serves to electrically connect the terminal electrodes 6, which are arranged in a peripheral portion of the upper face of the carrier body 1 at a relatively small pitch, to the contact electrodes 5, which are arranged on the lower face at a relatively large pitch. Since the electrode pads 8 of the LSI chip 7 are disposed in a peripheral portion of the LSI chip 7, the terminal electrodes 6 can only be disposed in the above-mentioned peripheral portion of upper face of the carrier body 1. However, the positions of the contact electrodes 5 are not limited to a peripheral portion of the lower face of the carrier body 1. By utilizing the entire area of the lower face of the carrier body 1 when disposing the contact electrodes 5, it becomes possible to efficiently dispose the contact electrodes 5 at a relatively large pitch. As a result, it becomes easier to prevent adjoining ones of the contact electrodes 5 from being short-circuited. Increasing the pitch of the contact electrodes 5 also allows the size of each contact electrode 5 to be increased. As a result, a highly reliable electrical/mechanical interconnection can be achieved between the contact electrodes 5 and the circuit substrate. In the present example, the minimum allowable pitch of the contact electrodes 5 is about 400 µm. It is also applicable to provide circuit elements, such as resistors and capacitors, in a portion of the intra-substrate wiring 4.

The LSI chip 7 is mounted on the chip carrier 12 in the following manner:

Referring back to FIG. 1, the projection electrodes 11, which are composed of Au and have a two-step shape, are formed on the electrode pads 8 of the LSI chip 7 by using a ball bonding method. Thereafter, the conductive adhesive 9 is transcribed onto a tip portion of each projection electrode 11. Next, the projection electrodes 11 are positioned so as to coincide with the terminal electrodes 6 of the chip carrier 12. Thereafter, the LSI chip 7 is disposed on the chip carrier 12, and the conductive adhesive 9 is thermally cured. Then, the interspace between the LSI chip 7 and the chip carrier 12 is filled with the mold resin 10, and the mold resin 10 is thermally cured. The projection electrodes 11, which are formed on the LSI chip 7, may have any structure, e.g. plated Au bumps, plated solder bumps, or solder ball bumps, as long as they permit flip mounting.

One of the important features of the chip carrier 12 and the chip package 19 according to the present invention is that the contact electrodes 5 of the chip carrier 12 are formed of a conductive adhesive filling the concave portions of the carrier body 1. As the conductive adhesive, a polymeric conductive adhesive manufactured by Ablestik Co., Ltd. (product number #8250) can be used, for example. The contact electrodes 5 being formed of such a conductive adhesive provides the following advantage:

The interspace between the chip package 19 and a circuit substrate on which the chip package 19 is mounted is greatly reduced as compared with the case where electrodes such as solder balls are used. Moreover, such contact electrodes 5 can be easily connected to any of the projection electrodes of the circuit substrate. By inserting the projection electrodes of the circuit substrate into the contact electrodes 5 of the chip package 19, problems such as creeping-up of the adhesive and short-circuiting between the projection electrodes can be prevented relatively easily. Furthermore, a large contact area is secured between the projection electrodes of the circuit substrate and the conductive adhesive, so that a large bonding strength is provided, thereby resulting in an improved reliability. In cases where the conductive adhesive has flexibility, in particular, the contact electrodes 5 become immune to cracks even when receiving a thermal impact.

Figure 2:
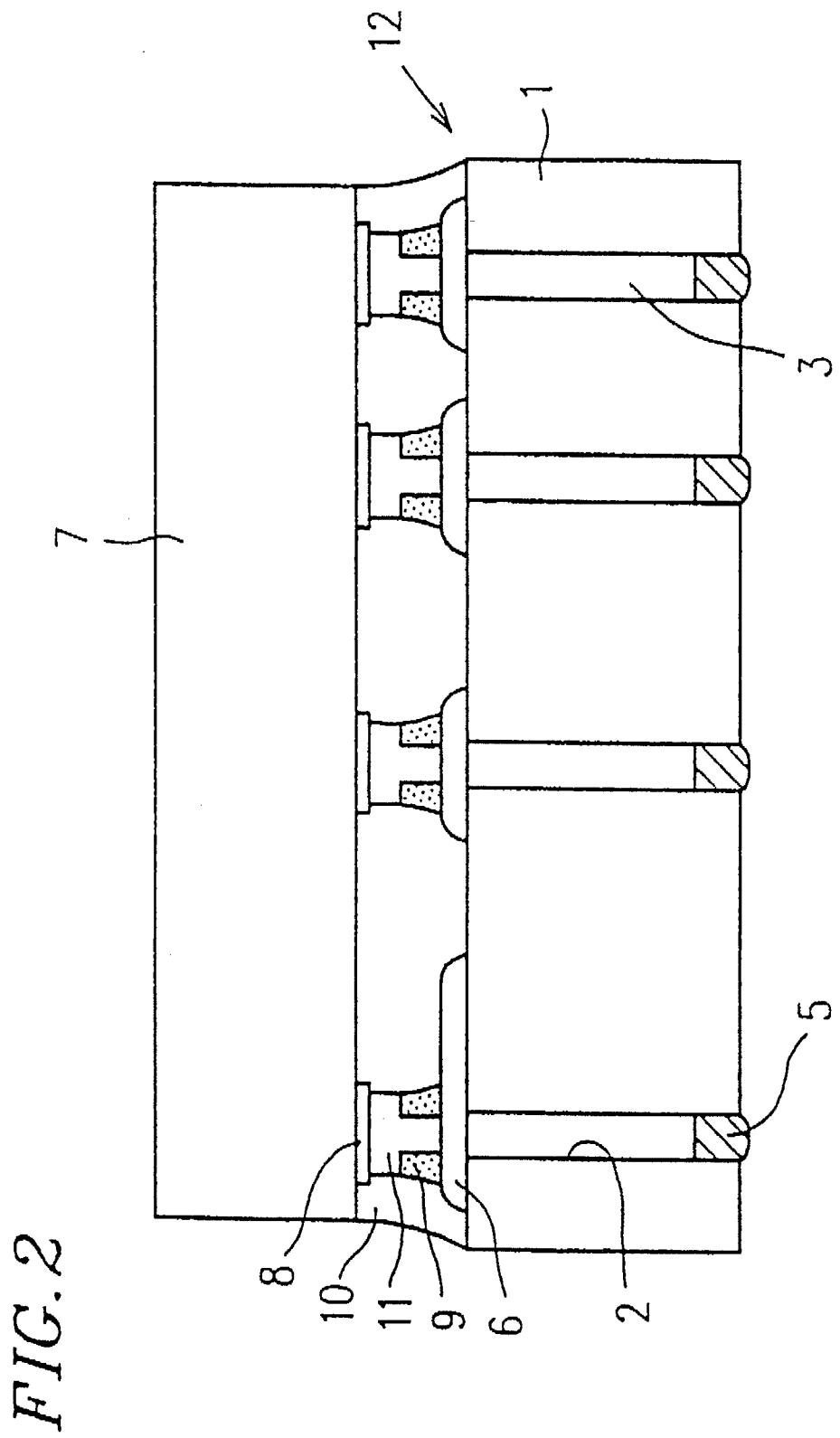
FIG. 2 is a schematic cross-sectional view showing another chip package according to the present invention.
Figure 4:
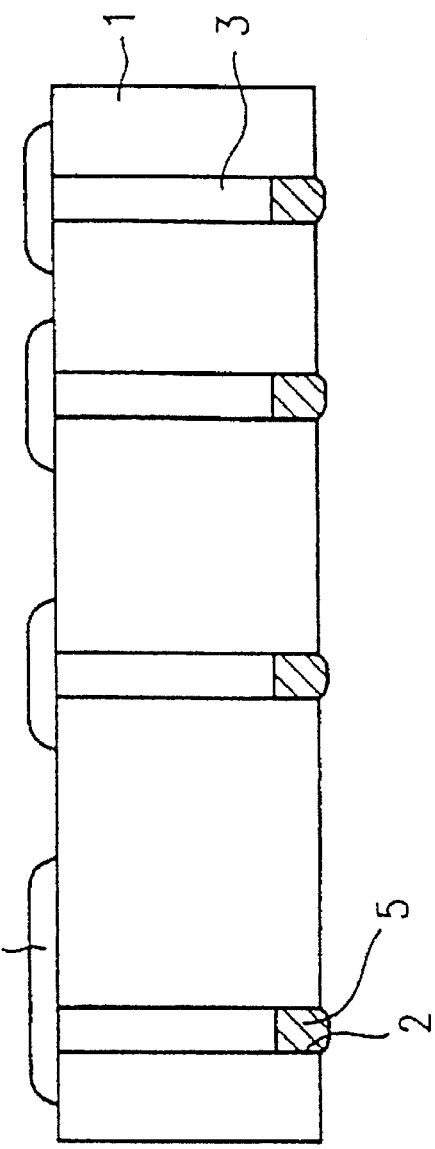
FIG. 4 is a schematic cross-sectional view showing another chip carrier according to the present invention.

It is also applicable to use a substrate shown in FIG. 4, in which contact electrodes 5 are directly electrically connected to terminal electrodes 6 by means of vias 3, as the carrier body 1 of the chip carrier 12 according to the present invention. An exemplary chip package incorporating such a substrate is shown in FIG. 2. In this chip package, no intra-substrate wiring is provided. However, leading wires (not shown) are provided on an upper face of the carrier body 1 so as to extend from the terminal electrodes 6, thereby making it possible to dispose via holes 2 and vias 3 in different positions from where the terminal electrodes 6 are located. Although the designing liberty for the chip carrier shown in FIG. 4 is reduced as compared with that for the chip carrier shown in FIG. 3, it is still possible to arrange the contact electrodes 5 in a different pattern from that for the terminal electrodes 6 in this manner. FIG. 2 shows this chip package in a state where an LSI chip 7 is mounted on the chip carrier 12.

Next, a method for producing a chip carrier according to the present invention will be described with reference to FIGS. 5A to 5I.

Figure 5A:
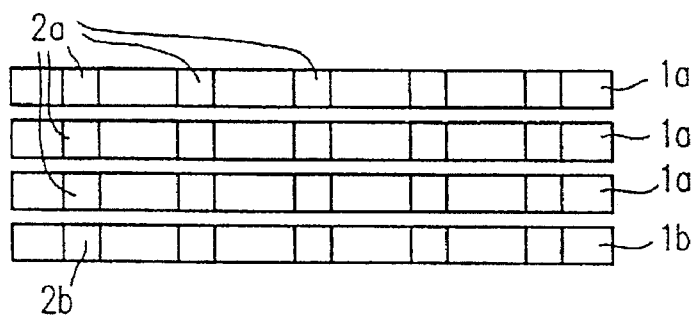
FIGS. 5A to 5I are cross-sectional views for describing the respective steps of a method for producing a chip carrier according to the present invention.

First, as shown in FIG. 5A, via holes 2a and 2b are formed in a plurality of unsintered ceramic green sheets 1a and 1b, respectively, by using a laser beam or by a mold punching method. In the case of forming the carrier body 1 shown in FIG. 3, the via holes 2a and 2b have different layout patterns depending on the green sheet 1a or 1b; however, in FIGS. 5A to 5I, the via holes 2a and 2b are shown to constitute the same layout pattern throughout the green sheets 1a and 1b for conciseness. In the case of forming the carrier body 1 shown in FIG. 4, the via holes 2a and 2b have the same layout pattern throughout the green sheets 1a and 1b.

A ceramic green sheet manufactured by Nippon Electric Glass Co., Ltd. (containing MLS-1000 as a main component) may be used as each green sheet 1a or 1b, for example. About five to ten such green sheets, having a thickness of about 200 μm, for example, are layered in order to form one carrier body 1. Such unsintered green sheets 1a and 1b (thickness: 200 μm) will have a thickness of 150 μm after being sintered, so that the carrier body 1 will finally have a thickness in the range of 0.7 mm to 1.5 mm. The thickness of the carrier body 1 is preferably small, so that the thicknesses of the chip carrier and the chip package are reduced.

Figure 5B:
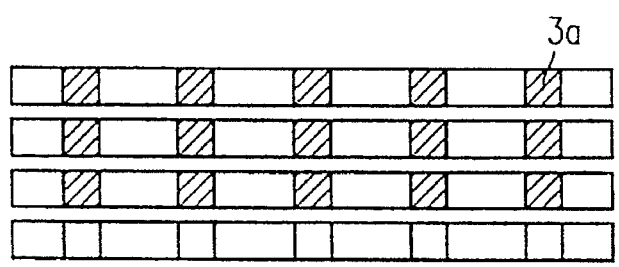

Next, as shown in FIG. 5B, vias 3a are formed by burying a conductive material in the via holes 2a of the green sheets 1a by printing. Thereafter, as shown in FIG. 5F, intra-substrate wiring 4a is formed by printing. Thus, the component elements of the internal conductor are formed.

The green sheet 1b, whose via holes 2b have no vias formed therein, is layered on the plurality of green sheets 1a to form a multilayer structure. Thereafter, the multilayer structure is pressed while being heated. Next, as shown in FIG. 5G, the layered green sheets 1a and 1b are sintered, whereby the carrier body 1 is formed with a plurality of concave portions 2b provided in a lower face thereof. The concave portions 2b are constituted by the via holes 2b (unfilled) of the lowermost sheet 1b of the carrier body 1. The production steps of the carrier body 1 described heretofore may be replaced by any other conventional method.

Figure 5C:
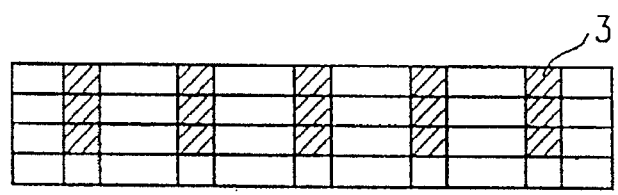
Figure 5D:
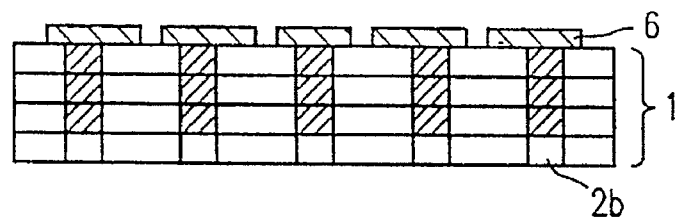
Figure 5E:
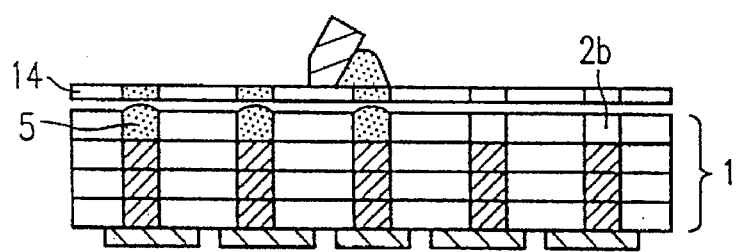
Figure 5F:
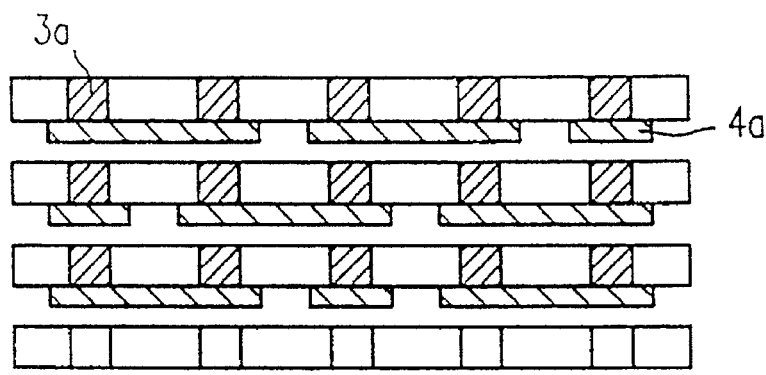
Figure 5G:
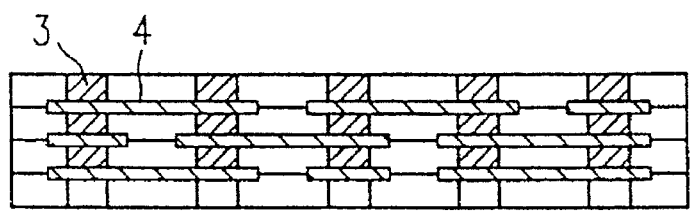
Figure 5H:
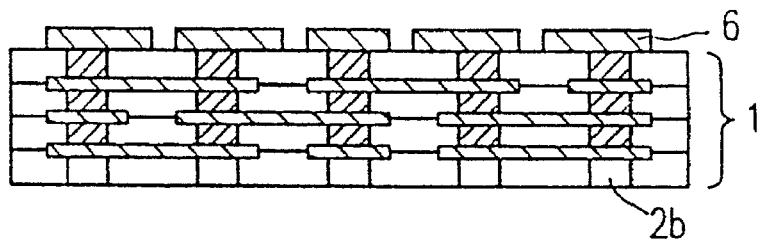
Figure 5I:
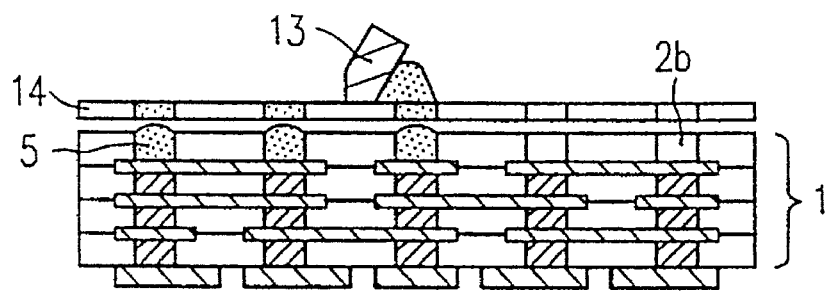

After sintering has been conducted, terminal electrodes 6 are formed on an upper face of the carrier body 1, as shown in FIG. 5H. Next, as shown in FIG. 5I, a conductive adhesive is buried in the plurality of concave portions 2b disposed on a face of the carrier body 1 that opposes a circuit substrate by being printed through a print mask 14. Squeegees 13 are used for the printing process. Thus, the conductive adhesive is buried in the concave portions 2b of the carrier body 1, so as to form contact electrodes 5. The conductive adhesive may have flexibility. The conductive adhesive includes conductive particles; the conductive particles are preferably formed of AgPd, Au, Ag, Cu or a complex alloy powder.

The contact electrodes 5 filling the concave portions 2b may or may not project from the carrier body 1. In the case where the contact electrodes 5 do not project from the carrier body 1, electrodes provided on the circuit substrate are required to have a shape insertable into the concave portions 2b of the carrier body 1.

In the case where the carrier body 1 is formed by the above-mentioned method, the length of each contact electrode 5, i.e., the size thereof along a direction perpendicular to the lower face of the carrier body 1, is determined in accordance with the thickness of the green sheet 1b constituting the lowermost layer of the carrier body 1. If the green sheet 1b has a thickness of 150 μm after the sintering, each contact electrode 5 has a length in the range of 150 μm to 170 μm. If the length of each contact electrode 5 is increased, the relatively large electrical resistance component which the contact electrodes 5 have becomes unnegligible. Therefore, the length of the contact electrodes 5 is preferably maintained equal to or smaller than about 200 μm.

In cases where the internal conductor is a base metal, inner side faces of the via holes 2b may be plated with an non-oxidizable conductor such as Au before filling the conductive adhesive in the via holes 2b of the green sheet 1b. By conducting such a plating, the area in which the conductive adhesive electrically contacts the internal conductor increases, so that the electrical resistance between the contact electrodes 5 and the internal conductor can be reduced.

The step of forming the contact electrodes 5 may be performed either before or after mounting the LSI chip 7 on the terminal electrodes 6 of the carrier body 1. In some cases, a chip package which includes the LSI chip 7 mounted on the chip carrier but does not include the contact electrodes 5 may be sold to a user. In such cases, the contact electrodes 5 will be buried in the concave portions 2b on the lower face of the carrier body 1 at least before the chip package is mounted on a circuit substrate.

The material of the carrier body 1 may be alumina having good radiation properties, instead of a glass ceramic.

In the case where the chip carrier shown in FIG. 4 is produced, the formation of the intra-substrate wiring 4 is omitted, so that the steps shown in FIGS. 5A to 5E are performed. FIGS. 5C to 5E correspond to FIGS. 5G to 5I, respectively.

Next, the structure of electrodes of a circuit substrate 17 suitable for the chip carrier 12 and the chip package 19 will be described with reference to FIG. 6. The circuit substrate 17 includes terminal electrodes 6 of a two-step convex shape. These terminal electrodes 6 are suitably used in the case where the contact electrodes 5 of the carrier body 1 do not substantially project from the lower face of the carrier body 1.

The circuit substrate 17 shown in FIG. 6 includes electrode pads 16 formed on an upper face thereof. The circuit substrate 17 further includes the terminal electrodes 18 on the electrode pads 16, each terminal electrode 18 having a two-step convex shape. Each terminal electrode 18 has a lower step portion formed on the circuit substrate 17 and an upper step portion formed on the lower step portion. The shape of the terminal electrodes 18 may be either circular or rectangular when seen from above the circuit substrate 17. The area of a cross section of the upper step portion, taken in parallel to the circuit substrate 17, is preferably smaller than the area of the lower step portion taken on the same plane. The terminal electrodes 18 can be formed of platable metals such as Au, Cu, Ag, and solder. The electrode pads 16 may be formed of any platable material. The circuit substrate 17 may include via holes 22, vias 23, and intra-substrate wiring 24 as shown in FIG. 6.

Next, a method for forming the two-step convex terminal electrodes 18 on a circuit substrate will be described with reference to FIGS. 7A to 7D.

Figure 7C:
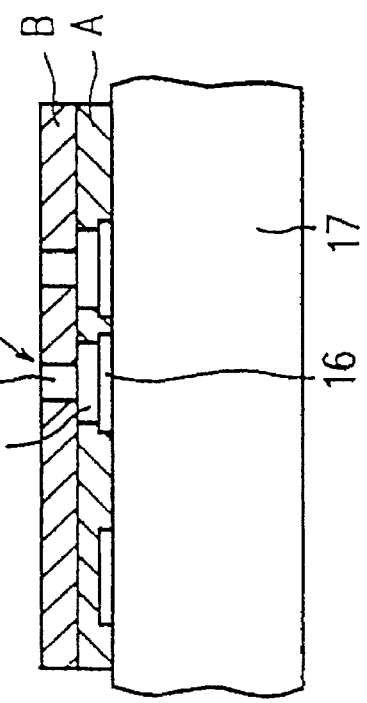
FIGS. 7A to 7D are cross-sectional views for describing the respective steps of a method for forming the convex terminal electrodes shown in FIG. 6.
Figure 7D:
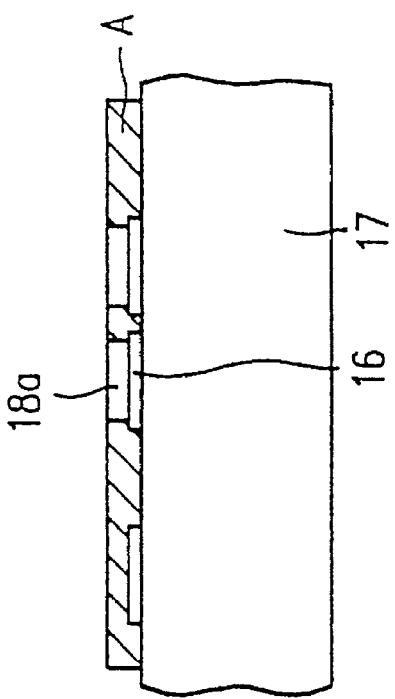
Figure 7A:

First, as shown in FIG. 7A, a resist film A is formed on the circuit substrate 17, on which the electrode pads 16 are provided, by a photolithography process. The resist film A has openings (inner diameter: about 250 μm) formed on those electrode pads 16 which are to be connected to the contact electrodes 5 of the chip carrier 12.

Figure 7B:
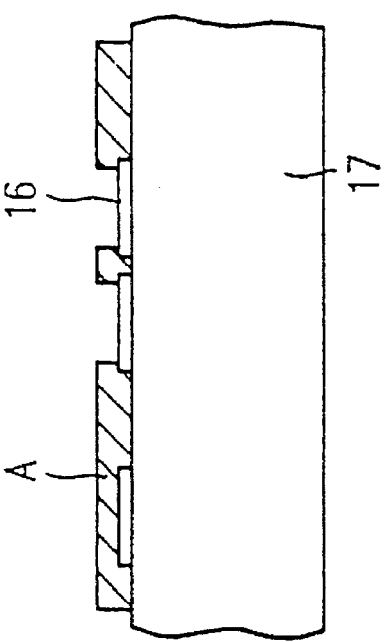

Next, as shown in FIG. 7B, the lower step portions 18a (thickness: about several dozen μm) of the terminal electrodes 18 are deposited in the openings of the resist film A. Thus, the lower step portions 18a of the terminal electrodes 18 are selectively formed in the regions of the circuit substrate 17 which are not covered by the resist film A. The shape and size of the lower step portions 18a of the terminal electrodes 18 are determined by the shape and size of the openings of the resist film A. The layout pattern for the lower step portions 18a is determined by that of the openings of the resist film A.

Then, as shown in FIG. 7C, a resist film B is formed on the circuit substrate 17 by a photolithography process. The resist film B has an opening (inner diameter: about 100 μm) in the vicinity of the center of the lower step portion 18a of each terminal electrode 18. The openings of the resist film B are formed so as to be smaller than the openings of the resist film A. Next, as shown in FIG. 7D, the upper step portions 18b (height: about several dozen μm) of the terminal electrodes 18 are deposited by plating.

Finally, the resist films A and B are removed by being dissolved or pealed. Thereafter, if necessary, a cleaning process is performed, so as to obtain the terminal electrodes 18 having a two-step convex shape on the electrode pads 16 of the circuit substrate 17.

The present invention does not provide any particular limitations to the plating material. Any platable metal, such as Au, Cu, Ag, and solder, can be used as the plating material.

Figure 8:
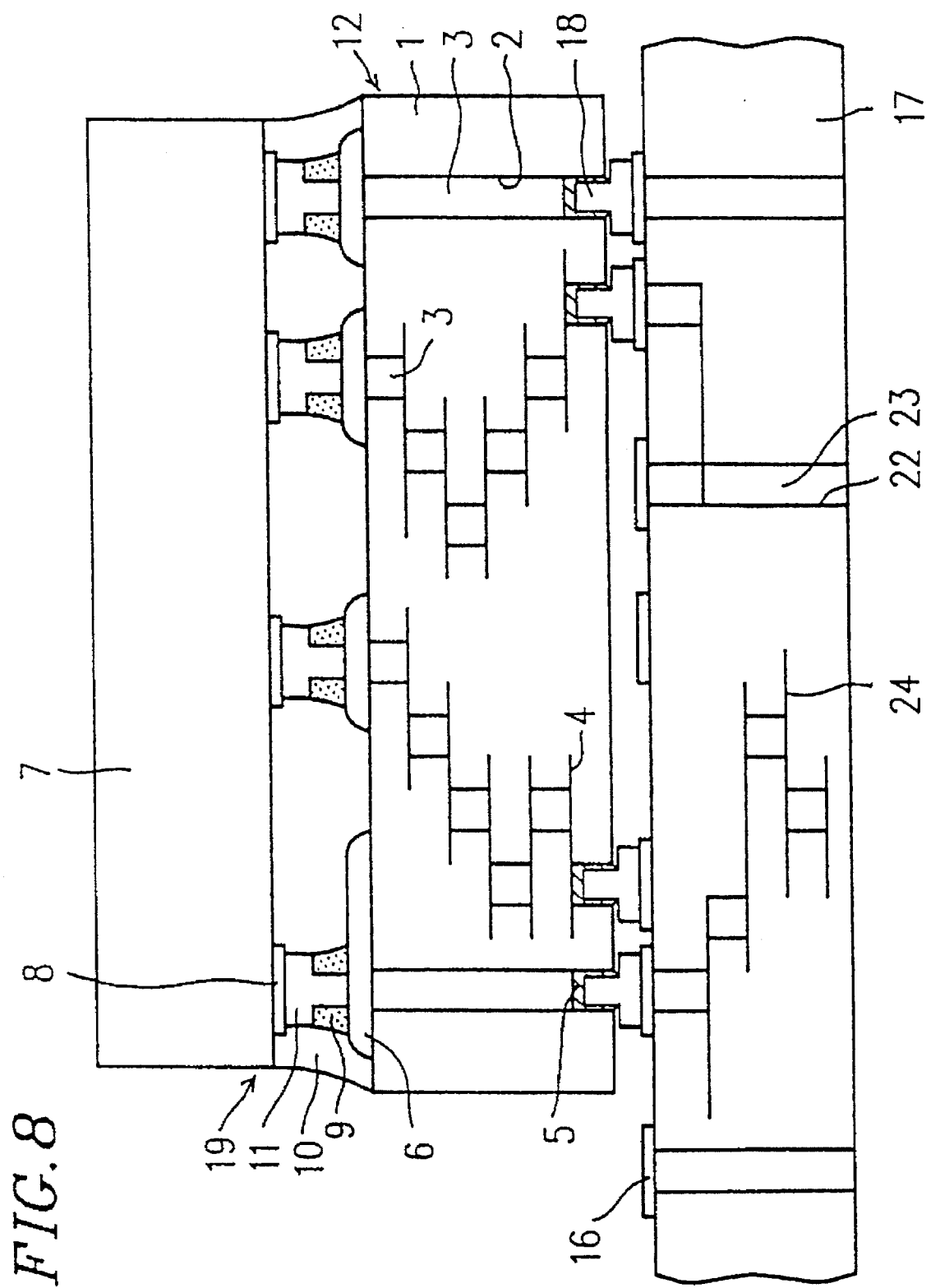
FIG. 8 is a schematic cross-sectional view showing a chip package-mounted complex according to the present invention.

Next, a process for mounting the chip package according to the present invention on the above-mentioned circuit substrate will be described with reference to FIG. 8.

After forming the contact electrodes 5 of the chip package 19 with the use of a conductive adhesive, the contact electrodes 5 are positioned so that the position of each contact electrode 5 coincides with the position of the corresponding one of the terminal electrodes 18 of the circuit substrate 17. The circuit substrate 17 used herein includes via holes and intra-substrate wiring.

Thereafter, the terminal electrodes 18 are inserted into the concave portions of the chip package 19. The contact electrodes 5 are previously filled in the concave portions of the chip package 19. Then, the conductive adhesive constituting the contact electrodes 5 is cured at 50° C. to 150° C. Thus, the contact electrodes 5 are electrically/mechanically connected to the terminal electrodes 18, whereby the chip package 19 is mounted on the circuit substrate 17. A chip package-mounted complex thus obtained has the following advantages: A firm connection is achieved between the contact electrodes 5 and the terminal electrodes 18 of the circuit substrate 17. Even if the thermal expansion coefficient of the circuit substrate 17 is different from that of the carrier body 1, the carrier body 1 is not likely to have cracks. In cases where the conductive adhesive has flexibility, in particular, the contact electrodes 5 can have excellent reliability against thermal impacts. In addition, the distance, (i.e. the interspace) between the carrier body 1 and the circuit substrate 17 is reduced, so that the entire thickness of the chip package-mounted complex can be reduced.

Figure 9:
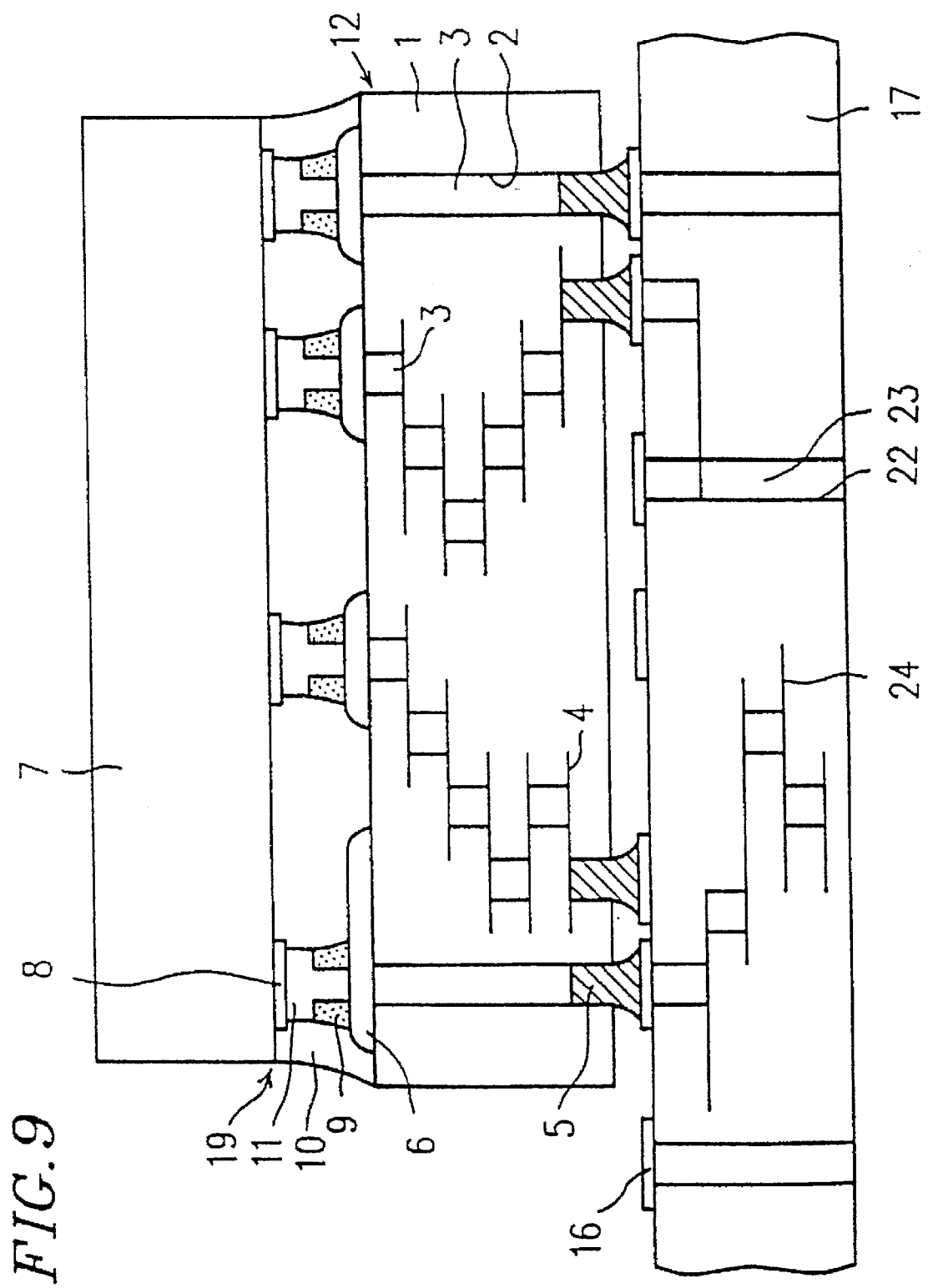
FIG. 9 is a schematic cross-sectional view showing another chip package-mounted complex according to the present invention.

FIG. 9 shows a chip package-mounted complex including the chip package 19 mounted on a circuit substrate 17 that includes no projection electrodes 18. In this example, the contact electrodes 5 are directly adhered to the electrode pads 16 of the circuit substrate 17.

As described above, according to the examples of the present invention, the LSI chip 7 is mounted on the chip carrier 12 in a flip-chip fashion, so that the chip package 19 occupies a relatively small area and is thin. In addition, the wiring within the chip package 19 extends for a relatively small distance, thereby achieving excellent frequency characteristics.

Furthermore, the contact electrodes 5 of the chip carrier 12 are formed of a conductive adhesive buried in the concave portions on the lower face of the carrier body 1. By inserting the two-step convex shape terminal electrodes 18 formed on the electrode pads 16 of the circuit substrate 17 into the contact electrodes 5, stable interconnection can be achieved between the terminal electrodes 18 and the contact electrodes 5. The entire thickness of a chip package-mounted complex, obtained by mounting the chip package 19 on the circuit substrate 17, can also be reduced.

Thus, according to the present invention, a chip package (including an LSI chip mounted on a chip carrier) is provided which occupies a relatively small area. Moreover, after the chip package is mounted on a circuit substrate, the thickness of the chip package as measured from the circuit substrate is kept small. Therefore, the chip package according to the present invention is ideal for high-density mounting.

Since contact electrodes of the chip package are formed of a conductive adhesive which preferably has flexibility, the chip package can be mounted on a circuit substrate by inserting two-step projection electrodes formed on terminal electrodes of the circuit substrate into the contact electrodes while maintaining the thickness of the resultant circuit module obtained after the mounting.

Furthermore, when the two-step convex terminal electrodes formed on the circuit substrate are inserted into the contact electrodes of the chip package, the convex shape of the terminal electrodes prevents creeping-up of the adhesive and short-circuiting between adjoining terminal electrodes. Moreover, such terminal electrodes come in contact with the conductive adhesive with a high probability and in a large adhesion area. As a result, large adhesion strength can be provided, thereby increasing the reliability of the bonding.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a chip carrier comprising the steps of:

forming via holes in a plurality of unsintered green sheets;

burying a portion of an internal conductor in the via holes of a group of the plurality of green sheets and forming an internal conductor on the group of the plurality of green sheets by printing;

obtaining a multilayer structure by layering one of the plurality of green sheets in which a portion of the internal conductor is not buried in the via holes thereof on the group of green sheets in which the portion of the internal conductor is buried in the via holes and subjecting the multilayer structure to a pressing process; and sintering the plurality of green sheets so as to form a carrier body, a plurality of concave portions being formed on a lower face of the carrier body.

2. A method for producing a chip carrier according to claim 1 further comprising a step of forming a plurality of contact electrodes by burying a conductive adhesive in the plurality of concave portions of the carrier body.

3. A method for producing a chip carrier according to claim 2, wherein the conductive adhesive has flexibility.

4. A method for producing a terminal electrode for a circuit substrate, the method comprising the steps of:

forming a first resist film on the circuit substrate by a first photolithography process, the first resist film having a first opening on an electrode pad of the circuit substrate;

forming a lower step portion of the terminal electrode in the first opening of the first resist film;

forming a second resist film on the circuit substrate by a second photolithography process, the second resist film having a second opening on the lower step portion of the terminal electrode and the second opening being smaller than the first opening of the first resist film;

forming an upper step portion of the terminal electrode in the second opening of the second resist film; and removing the first and second resist films, whereby the terminal electrode is formed.

5. A method for producing a chip carrier according to claim 1, wherein the internal conductor is composed of a material selected from the group consisting of Cu, Ag, and AgPd.

6. A method for producing a chip carrier according to claim 2, wherein the conductive adhesive is a polymeric conductive adhesive.

7. A method for producing a chip carrier according to claim 2, wherein the conductive adhesive comprises conductive particles formed of AgPd, Au, Ag, Cu or a complex alloy powder.

8. A method for producing a chip carrier according to claim 1 further comprising the step of plating inner side faces of the via holes with a non-oxidizable conductor.

9. A method for producing a chip carrier according to claim 8, wherein the non-oxidizable conductor is Au.

10. A method for producing a terminal electrode for a circuit substrate according to claim 4, wherein an area of a cross section of the upper step portion taken on a plane parallel to the circuit substrate is smaller than an area of a cross section of the lower step portion taken on a plane parallel to the circuit substrate.

11. A method for producing a terminal electrode for a circuit substrate according to claim 4, wherein the terminal electrode is formed of a platable metal.

12. A method for producing a terminal electrode for a circuit substrate according to claim 4, wherein the terminal electrode is formed of Au, Cu, Ag, or solder.

* * * * *